(12) United States Patent
Lu (10) Patent No.: US 9,917,208 B2
(45) Date of Patent: Mar. 13, 2018

(54) THIN FILM TRANSISTOR AND METHOD FOR MANUFACTURING THE SAME, AND ARRAY SUBSTRATE

(71) Applicant: Shenzhen China Star Optoelectronics Technology Co., Ltd., Shenzhen, Guangdong (CN)

(72) Inventor: Macai Lu, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 14/786,055

(22) PCT Filed: Jul. 14, 2015

(86) PCT No.: PCT/CN2015/083931
§ 371 (c)(1),
(2) Date: Dec. 13, 2016

(87) PCT Pub. No.: WO2017/004840
PCT Pub. Date: Jan. 12, 2017

(65) Prior Publication Data
US 2017/0162712 A1  Jun. 8, 2017

(30) Foreign Application Priority Data
Jul. 7, 2015  (CN) .......................... 2015 1 0394548

(51) Int. Cl.
*H01L 29/786* (2006.01)
*H01L 29/06* (2006.01)
(Continued)

(52) U.S. Cl.
CPC .... *H01L 29/78696* (2013.01); *H01L 21/0337* (2013.01); *H01L 21/266* (2013.01); *H01L 21/32134* (2013.01); *H01L 29/0665* (2013.01)

(58) Field of Classification Search
CPC ................ H01L 21/266; H01L 21/426; H01L 29/78696
See application file for complete search history.

(56) References Cited

U.S. PATENT DOCUMENTS

| 5,949,188 A | 9/1999 | Leising et al. |
| 2005/0139867 A1 | 6/2005 | Saito et al. |

(Continued)

FOREIGN PATENT DOCUMENTS

| CN | 1804122 | 7/2006 |
| CN | 101596598 | 12/2009 |

(Continued)

OTHER PUBLICATIONS

Search Report and Written Opinion, dated Apr. 1, 2016, for International Application No. PCT/CN2015/083931.
(Continued)

*Primary Examiner* — Bryan Junge
(74) *Attorney, Agent, or Firm* — Kim Winston LLP (57) ABSTRACT

A TFT, a method for manufacturing the TFT, and an array substrate are disclosed. In the TFT according to the present disclosure, the nano conductive points that are independent from one another are formed in a channel area of the active layer, so that the channel area of the active layer can be divided into a plurality of sub channels that are independent from one another, and an equivalent electric field strength thereof can be increased. The larger the equivalent electric field strength is, the higher the carrier mobility ratio would be, and the larger the saturation current of the TFT would become. Therefore, the TFT with a higher definition and a higher aperture ratio can be manufactured.

4 Claims, 5 Drawing Sheets

(51) Int. Cl.
*H01L 21/266* (2006.01)
*H01L 21/033* (2006.01)
*H01L 21/3213* (2006.01)

(56) References Cited

U.S. PATENT DOCUMENTS

2013/0032784 A1* 2/2013 Chaji ............... H01L 29/78696
257/27
2014/0326989 A1* 11/2014 Zan ................... H01L 29/78696
257/43

FOREIGN PATENT DOCUMENTS

| CN | 101689607 | 3/2010 |
| CN | 102856211 | 1/2013 |
| CN | 102943187 | 2/2013 |
| CN | 103972235 | 8/2014 |
| CN | 104157698 | 11/2014 |
| CN | 104538396 | 4/2015 |

OTHER PUBLICATIONS

Office Action and Search Report, dated Aug. 1, 2017 for Chinese Patent Application No. 201510394548.3.
Smirnov, V.K., et al., "Technology for nanoperiodic doping of a metal-oxide semiconductor field-effect transistor a channel using a self-forming wave-ordered structure," Nanotechnology, 2003, 709-715, 14-7, IOP Publishing Ltd., UK.

* cited by examiner

THIN FILM TRANSISTOR AND METHOD FOR MANUFACTURING THE SAME, AND ARRAY SUBSTRATE

CROSS REFERENCE TO RELATED APPLICATION

The present application claims benefit of Chinese patent application CN 201510394548.3, entitled "Thin Film Transistor and Method for Manufacturing the Same, and Array Substrate" and filed on Jul. 7, 2015, the entirety of which is incorporated herein by reference.

FIELD OF THE INVENTION

The present disclosure relates to the technical field of electronic device, and particularly to a Thin Film Transistor (TFT), an array substrate comprising the TFT, and a method for manufacturing the TFT.

BACKGROUND OF THE INVENTION

TFT is a kind of transistor and is widely used in display field. The TFT in the prior art comprises a gate, a gate insulation layer, an active layer, a source, and a drain.

A display panel generally comprises an array substrate. The array substrate is provided with a plurality of pixels, each of which corresponds to one TFT. Each of the pixels is controlled by a corresponding TFT, so that an image can be displayed. The requirement for the performance of the TFT is increasingly high with the development of the display industry. In general, the TFT needs to have a relatively large saturation current. The saturation current of the TFT can be obtained through the following equation:

$$I_{ds} = \frac{1}{2} u C_{OX} \frac{W}{L} (V_{gs} - V_{th})^2,$$

wherein u represents a carrier mobility ratio of the active layer, $C_{OX}$ represents a capacitance of per unit area of insulation layer, W represents a channel width of the TFT, L represents a channel length of the TFT, $V_{gs}$ represents an electric potential difference between the gate and the source, and $V_{th}$ represents a threshold voltage. It can be seen from the above equation that, u, W, and L are all main factors affecting the saturation current of the TFT. In the TFT, short circuit would easily occur to a source-drain metal layer if a value of L is too small. At the same time, an aperture ratio of the TFT would be reduced and a direct coupling capacitance between the source-drain and the gate would be increased if a value of W is too large. Therefore, increasing a value of u is one of the most effective methods for improving the saturation current of the TFT. In a word, a TFT with a relatively high carrier mobility ratio is urgently needed.

SUMMARY OF THE INVENTION

There is not a TFT with a relatively high carrier mobility ratio in the prior art, and the present disclosure aims to solve the technical problem.

In order to solve the aforesaid technical problem, the present disclosure provides a TFT, a method for manufacturing the TFT, and an array substrate.

According to a first aspect, the present disclosure provides a TFT, comprising a gate, an insulation layer, a source, a drain, and an active layer, wherein the active layer comprises nano conductive points that are independent from one another.

Preferably, a diameter of each nano conductive point ranges from 10 Å to 1000 Å. Preferably, the TFT is a bottom-gate TFT or a top-gate TFT.

According to a second aspect, the present disclosure provides an array substrate which comprises the aforesaid TFT.

According to a third aspect, the present disclosure provides a method for manufacturing a TFT, comprising: forming a multi-layer structure comprising a gate, an insulation layer, a source, a drain, and an active layer, so that the active layer comprises nano conductive points that are independent from one another.

Preferably, a step of forming a multi-layer structure comprising a gate, an insulation layer, a source, a drain, and an active layer, so that the active layer comprises nano conductive points that are independent from one another includes the following sub steps: forming the gate; forming the insulation layer on the gate; forming the active layer on the insulation layer; forming a pattern which comprises the source and the drain on the active layer, the pattern being made of metal alloy; forming a nano point mask in an area of the pattern corresponding to the active layer through a de-alloying method; and forming the nano conductive points that are independent from one another in the active layer by the nano point mask.

Preferably, the nano conductive points that are independent from one another are formed in the active layer by the nano point mask through an ion injection method.

Preferably, a step of forming a multi-layer structure comprising a gate, an insulation layer, a source, a drain, and an active layer, so that the active layer comprises nano conductive points that are independent from one another includes the following sub steps: forming the active layer; forming a pattern which comprises the source and the drain on the active layer, the pattern being made of metal alloy; forming a nano point mask in an area of the pattern corresponding to the active layer through a de-alloying method; forming the nano conductive points that are independent from one another in the active layer by the nano point mask; removing the nano point mask; forming the insulation layer on the active layer which comprises the nano conductive points and on the pattern; and forming the gate on the insulation layer.

Preferably, the nano conductive points that are independent from one another are formed in the active layer by the nano point mask through an ion injection method.

Preferably, a diameter of each nano conductive point ranges from 10 Å to 1000 Å.

Compared with the prior art, one embodiment or a plurality of embodiments according to the present disclosure may have the following advantages or beneficial effects.

According to the present disclosure, the nano conductive points that are independent from one another are formed in a channel area of the active layer, so that the channel area of the active layer can be divided into a plurality of sub channels that are independent from one another, and an equivalent electric field strength thereof can be increased. The larger the equivalent electric field strength is, the higher the carrier mobility speed and the carrier mobility ratio would be, and the larger the saturation current of the TFT would become. Therefore, the TFT with a higher definition and a higher aperture ratio can be manufactured, and the performance of the TFT can be improved.

Other features and advantages of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure and constitute one part of the description. The drawings are used for interpreting the present disclosure together with the embodiments, not for limiting the present disclosure. In the drawings.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

Conventionally, there is not a TFT with a relatively high carrier mobility ratio. To this end, the embodiment of the present disclosure provides a TFT with a relatively high carrier mobility ratio in order to solve the aforesaid technical problem. According to the embodiment of the present disclosure, the TFT mainly comprises a gate, an insulation layer, a source, a drain, and an active layer. A signal is loaded on the gate and the source at the same time, so that the source and the drain can be electrically connected with each other by the active layer. The active layer comprises nano conductive points that are independent from one another.

In the TFT according to the present embodiment, the nano conductive points that are independent from one another are formed in a channel area of the active layer, so that the channel area of the active layer can be divided into a plurality of sub channels that are independent from one another, and an equivalent electric field strength thereof can be increased. The larger the equivalent electric field strength is, the higher the carrier mobility speed and the carrier mobility ratio would be, and the larger the saturation current of the TFT would become. Therefore, the TFT with a higher definition and a higher aperture ratio can be manufactured, and the performance of the TFT can be improved.

In order to further improve the carrier mobility ratio of the active layer, according to one preferred embodiment of the present disclosure, a diameter of each nano conductive point is selected from a range of 10 Å to 1000 Å.

In addition, the source, the drain, and the gate are three poles of the TFT. The TFTs can be divided into two kinds according to the position relationship of the poles. In one kind of TFT, the gate is arranged below the source and the drain, and this kind of TFT is referred to as a bottom-gate TFT. In another kind of TFT, the gate is arranged above the source and the drain, and this kind of TFT is referred to as a top-gate TFT. According to the embodiment of the present disclosure, the TFT can be a top-gate TFT or a bottom-gate TFT. The embodiment of the present disclosure and the accompanying drawings will be illustrated first taking the bottom-gate TFT as an example.

Figure 1:
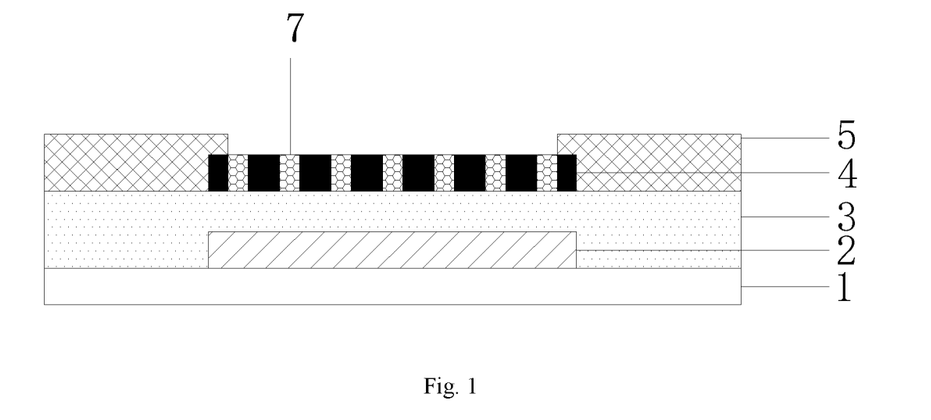
FIG. 1 schematically shows a structure of a bottom-gate TFT according to one embodiment of the present disclosure.

FIG. 1 schematically shows a structure of a bottom-gate TFT according to the embodiment of the present disclosure. As shown in FIG. 1, according to the present embodiment, the bottom-gate TFT comprises a substrate 1, a gate 2, an insulation layer 3, an active layer 4, a source, and a drain.

Specifically, the gate 2 is formed on the substrate 1, the insulation layer 3 is formed on the gate 2, and the active layer 4 is formed on the insulation layer 3. The active layer 4 comprises nano conductive points 7 that are independent from one another. A pattern 5 which comprises the source and the drain is formed on the active layer 4. In addition, a passivation layer and a pixel electrode are further formed on the pattern 5 which comprises the source and the drain in sequence. The pixel electrode is connected with the pattern 5 which comprises the source and the drain through via holes in the passivation layer.

The embodiment of the present disclosure further provides an array substrate which comprises the aforesaid TFT, and the array substrate can be used in the technical field of liquid crystal display.

In addition, the embodiment of the present disclosure further provides a method for manufacturing the aforesaid TFT. The method according to the present embodiment comprises a step of forming a multi-layer structure comprising a gate 2, an insulation layer 3, a source, a drain, and an active layer 4, which comprises nano conductive points 7 that are independent from one another.

In the method for manufacturing the TFT according to the present embodiment, the nano conductive points 7 that are independent from one another are formed in a channel area of the active layer 4, so that the channel area of the active layer 4 can be divided into a plurality of sub channels that are independent from one another, and an equivalent electric field strength thereof can be increased. The larger the equivalent electric field strength is, the higher the carrier mobility speed and the carrier mobility ratio would be, and the larger the saturation current of the TFT would become. Therefore, the TFT with a higher definition and a higher aperture ratio can be manufactured, and the performance of the TFT can be improved.

The TFT manufactured according to the method of the present embodiment can be a top-gate TFT, or a bottom-gate TFT.

Figure 2:
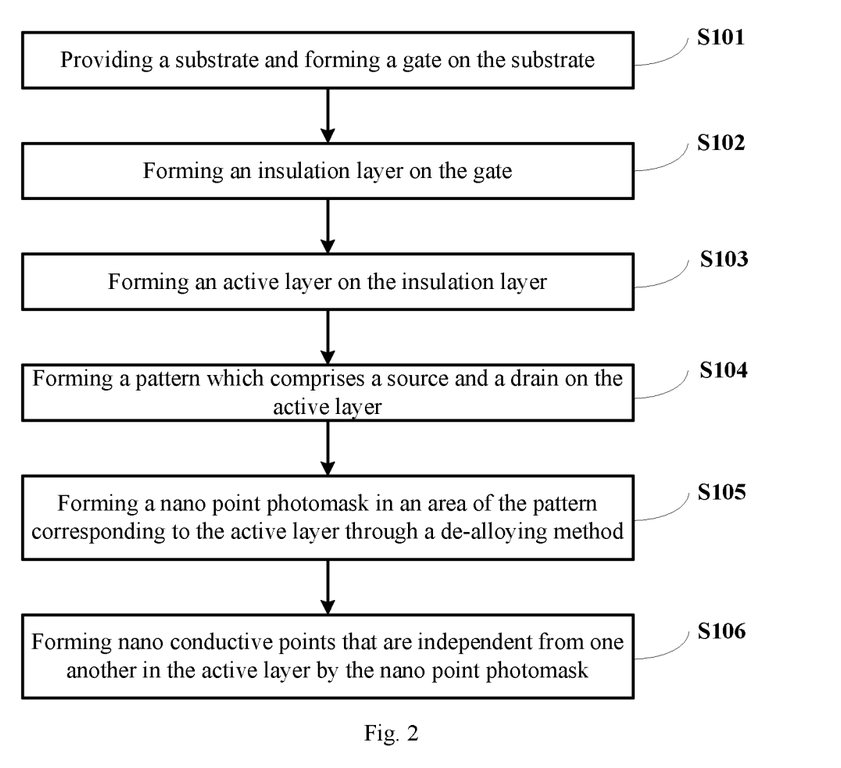
FIG. 2 is a flow chart of a method for manufacturing the bottom-gate TFT according to one embodiment of the present disclosure.

FIG. 2 is a flow chart of the method for manufacturing the bottom-gate TFT according to the embodiment of the present disclosure. The manufacturing method according to the present embodiment mainly comprises step 101 to step 106.

In step 101, a substrate 1 is provided and a gate 2 is formed on the substrate 1.

Figure 3A:
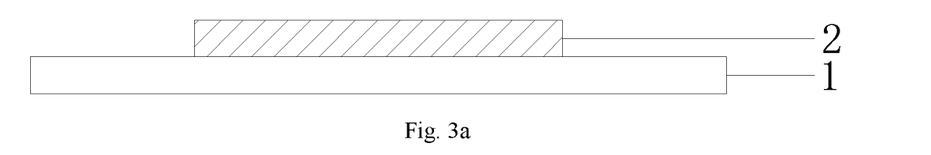
FIG. 3a schematically shows a structure after a gate is formed on a substrate according to the embodiment of the present disclosure.

Specifically, a metal layer is first deposited on the substrate 1, and the metal layer is coated with a photoresist material. Here, the metal layer can be an Mo—Al laminated structure, a Ti—Al laminated structure, or other single layer metal structure. Then, a pattern of the gate 2 as shown in FIG. 3a can be formed after exposing, developing, and etching.

In step 102, an insulation layer 3 is formed on the gate 2.

In step 103, an active layer 4 is formed on the insulation layer 3.

Figure 3B:
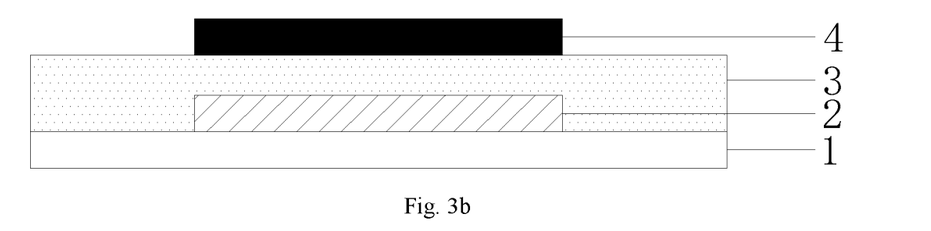
FIG. 3b schematically shows a structure after an insulation layer and an active layer are formed on the gate according to the embodiment of the present disclosure.

Specifically, hydrogenated amorphous silicon (a-Si:H), Indium Gallium Zinc Oxide (IGZO), or other semiconductor material is first deposited on the insulation layer 3, and the semiconductor material is coated with a photoresist material 6. Then, a pattern of the active layer 4 as shown in FIG. 3b can be formed after exposing, developing, and etching.

In step 104, a pattern 5 which comprises a source and a drain is formed on the active layer 4. The pattern 5 is made of metal alloy.

Figure 3C:
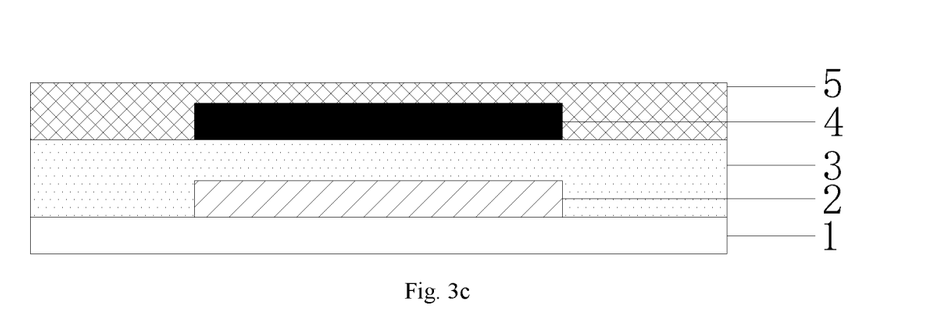
FIG. 3c schematically shows a structure after a pattern which comprises the source and the drain is formed on the active layer according to the embodiment of the present disclosure.

Specifically, as shown in FIG. 3c, a source-drain metal electrode layer is deposited on the active layer 4. The metal electrode layer can be made of Mo—Al, Mo—Ti, and other metal alloys.

In step 105, a nano point mask 51 is formed in an area of the pattern 5 corresponding to the active layer 4 through a de-alloying method.

Figure 3D:
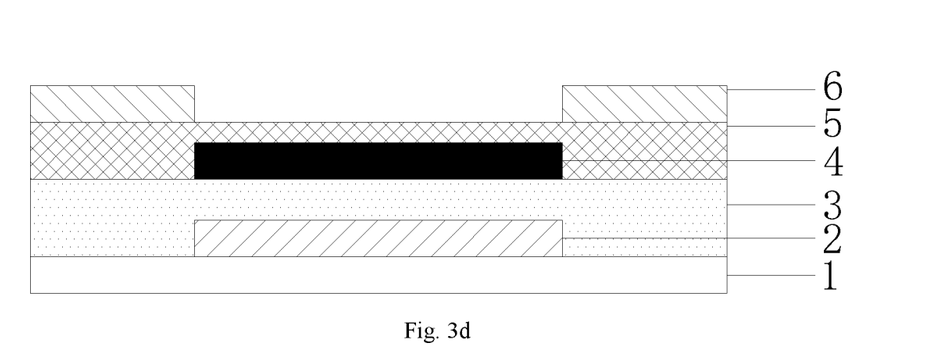
FIG. 3d schematically shows a structure after a photoresist material is formed on the pattern which comprises the source and the drain according to the embodiment of the present disclosure.
Figure 3E:
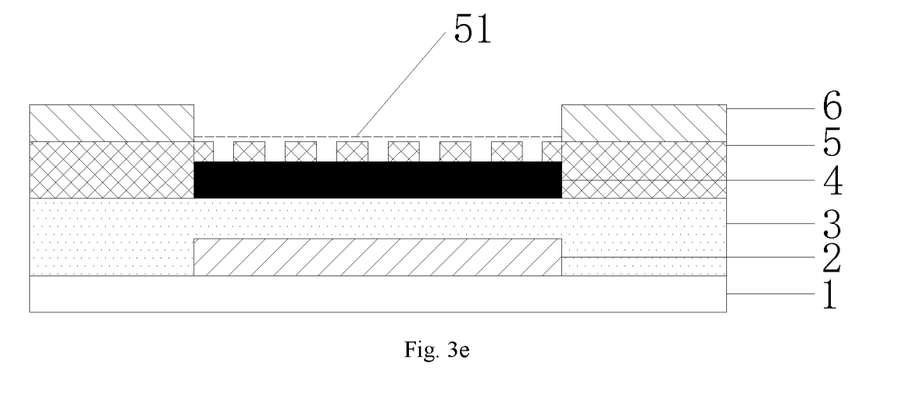
FIG. 3e schematically shows a structure after a nano point mask is formed in some area of the pattern according to the embodiment of the present disclosure.

Specifically, the pattern 5 which comprises the source and the drain is first coated with a photoresist material, and then the photoresist material in an area corresponding to the active layer 4 is removed through exposing and developing. FIG. 3d schematically shows a structure after the photoresist material in the area corresponding to the active layer 4 is removed. Then, the nano point mask 51 which comprises nanoscale micropores as shown in FIG. 3e can be formed in an area of the pattern 5 which is not covered by the photoresist material 6 through the de-alloying method.

Here, the de-alloying method is used for dissolving a certain constituent in part of the pattern 5 (the metal alloy) selectively.

In step 106, the nano conductive points 7 that are independent from one another are formed in the active layer 4 by the nano point mask 51.

Figure 3F:
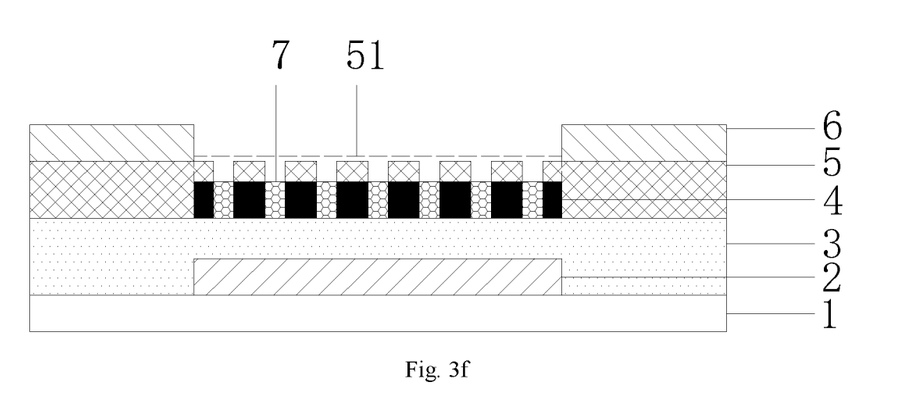
FIG. 3f schematically shows a structure after nano conductive points are formed in the active layer by the nano point mask according to the embodiment of the present disclosure.

Specifically, the plurality of nano conductive points 7 that are independent from one another as shown in FIG. 3f can be formed in the active layer 4 by the nano point mask 51 that is formed in step 105 in an ion injection method or other similar methods. It should be noted that, a structure of the nano point mask 51 formed therein can be regulated through controlling the components of the metal alloy and the de-alloying method, so that a size of each nano conductive point 7 and a distance between two adjacent nano conductive points 7 can be regulated. Specifically, a diameter of each nano conductive point ranges from 10 Å to 1000 Å.

The residual photoresist material 6 is removed through ashing technology, and the nano point mask 51 is etched away after the nano conductive points 7 are formed, so that the bottom-gate TFT as shown in FIG. 1 can be formed.

Figure 4:
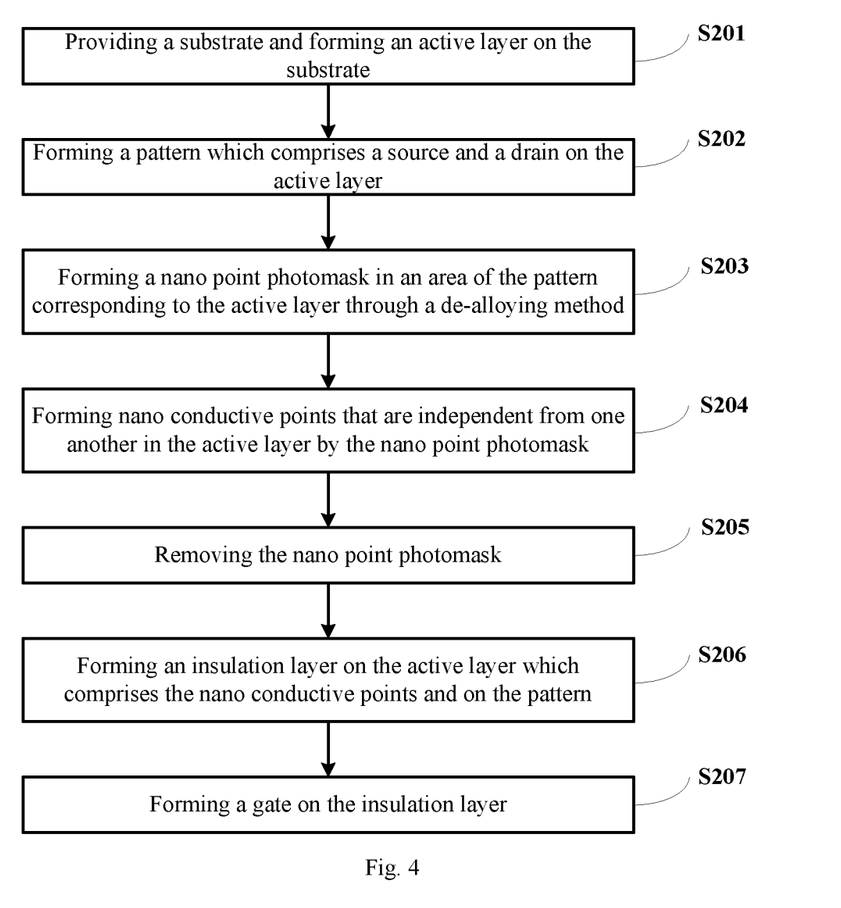
FIG. 4 is a flow chart of a method for manufacturing the top-gate TFT according to one embodiment of the present disclosure.

FIG. 4 is a flow chart of a method for manufacturing a top-gate TFT according to the embodiment of the present disclosure. The manufacturing method according to the present embodiment mainly comprises step 201 to step 207.

In step 201, a substrate 1 is provided, and an active layer 4 is formed on the substrate 1.

Specifically, the substrate 1 is first provided. Hydrogenated amorphous silicon (a-Si:H), Indium Gallium Zinc Oxide (IGZO), or other semiconductor material is deposited on the substrate 1, and the semiconductor material is coated with a photoresist material. Then, a pattern of the active layer 4 can be formed after exposing, developing, and etching.

In step 202, a pattern 5 which comprises a source and a drain is formed on the active layer 4. The pattern 5 is made of metal alloy.

Specifically, a source-drain metal electrode layer is deposited on the active layer 4. The metal electrode layer can be made of Mo—Al, Mo—Ti, and other metal alloys.

In step 203, a nano point mask 51 is formed in an area of the pattern 5 corresponding to the active layer 4 through a de-alloying method.

Specifically, the pattern 5 which comprises the source and the drain is first coated with a photoresist material, and the photoresist material in an area corresponding to the active layer 4 is removed through exposing and developing. Then, the nano point mask 51 which comprises nanoscale micropores can be formed in an area of the pattern 5 which is not covered by the photoresist material 6 through the de-alloying method.

In step 204, the nano conductive points 7 that are independent from one another are formed in the active layer 4 by the nano point mask 51.

Specifically, the plurality of nano conductive points 7 that are independent from one another can be formed in the active layer 4 by the nano point mask 51 that is formed in step 203 in an ion injection method or other similar methods. It should be noted that, a structure of the nano point mask 51 formed therein can be regulated through controlling the components of the metal alloy and the de-alloying method, so that a size of each nano conductive point 7 and a distance between two adjacent nano conductive points 7 can be regulated. Specifically, a diameter of each nano conductive point ranges from 10 Å to 1000 Å.

In step 205, the nano point mask is removed.

In step 206, an insulation layer 3 is formed on the active layer 4 which comprises the nano conductive points 7 and on the pattern 5.

In step 207, a gate 2 is formed on the insulation layer 3.

Specifically, a metal layer is first deposited on the insulation layer 3, and the metal layer is coated with a photoresist material. Here, the metal layer can be an Mo—Al laminated structure, a Ti—Al laminated structure, or other single layer metal structure. Then, a pattern of the gate 2 can be formed after exposing, developing, and etching.

The residual photoresist material is removed through ashing technology after the gate is formed, so that the top-gate TFT can be formed.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A method for manufacturing a TFT, comprising:
forming a multi-layer structure comprising a gate, an insulation layer, a source, a drain, and an active layer, so that the active layer comprises nano conductive points that are independent from one another,
wherein a step of forming a multi-layer structure comprising a gate, an insulation layer, a source, a drain, and an active layer, so that the active layer comprises nano conductive points that are independent from one another includes the following sub steps:
forming the gate;
forming the insulation layer on the gate;
forming the active layer on the insulation layer;
forming a pattern which comprises the source and the drain on the active layer, the pattern being made of metal alloy;
coating a photoresist material on the pattern which comprises the source and the drain, and removing the photoresist material in an area corresponding to the active layer through exposing and developing;
forming a nano point mask in an area of the pattern which is not covered by the photoresist material through a de-alloying method, wherein the de-alloying method is used for dissolving a certain constituent in part of the pattern selectively; and
forming the nano conductive points that are independent from one another in the active layer by the nano point mask through an ion injection method.

2. The method according to claim 1, wherein a diameter of each nano conductive point ranges from 10 Å to 1000 Å.

3. A method for manufacturing a TFT, comprising:
forming a multi-layer structure comprising a gate, an insulation layer, a source, a drain, and an active layer, so that the active layer comprises nano conductive points that are independent from one another;
wherein a step of forming a multi-layer structure comprising a gate, an insulation layer, a source, a drain, and an active layer, so that the active layer comprises nano conductive points that are independent from one another includes the following sub steps:
forming the active layer;
forming a pattern which comprises the source and the drain on the active layer, the pattern being made of metal alloy;
coating a photoresist material on the pattern which comprises the source and the drain, and removing the photoresist material in an area corresponding to the active layer through exposing and developing;
forming a nano point mask in an area of the pattern which is not covered by the photoresist material through a de-alloying method, wherein the de-alloying method is used for dissolving a certain constituent in part of the pattern selectively;
forming the nano conductive points that are independent from one another in the active layer by the nano point mask through an ion injection method;
removing the nano point mask;
forming the insulation layer on the active layer which comprises the nano conductive points and on the pattern; and
forming the gate on the insulation layer.

4. The method according to claim 3, wherein a diameter of each nano conductive point ranges from 10 Å to 1000 Å.

* * * * *